United States Patent
Ausschnitt

(10) Patent No.: US 7,042,551 B2
(45) Date of Patent: May 9, 2006

(54) METHOD OF PATTERNING PROCESS METROLOGY BASED ON THE INTRINSIC FOCUS OFFSET

(75) Inventor: Christopher P Ausschnitt, Lexington, MA (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 10/771,684

(22) Filed: Feb. 3, 2004

(65) Prior Publication Data

US 2005/0168716 A1    Aug. 4, 2005

(51) Int. Cl.
*G03B 27/52* (2006.01)
*G03B 27/32* (2006.01)
*G03B 11/02* (2006.01)

(52) U.S. Cl. ............................. 355/55; 355/77; 356/635
(58) Field of Classification Search ................... 355/30, 355/40, 53, 55, 67, 77; 356/40, 4.03, 4, 2, 356/4.06, 601, 629, 635
See application file for complete search history.

(56) References Cited

U.S. PATENT DOCUMENTS

| | | |
|---|---|---|
| 5,953,128 A | 9/1999 | Ausschnitt et al. |
| 5,965,309 A | 10/1999 | Ausschnitt et al. |
| 5,976,740 A | 11/1999 | Ausschnitt et al. |
| 6,004,706 A | 12/1999 | Ausschnitt et al. |
| 6,027,842 A | 2/2000 | Ausschnitt et al. |
| 6,128,089 A | 10/2000 | Ausschnitt et al. |
| 6,178,360 B1 * | 1/2001 | Pierrat et al. ............... 700/121 |
| 6,538,753 B1 * | 3/2003 | Grodnensky et al. ........ 356/625 |
| 6,689,519 B1 * | 2/2004 | Brown et al. .................. 430/30 |
| 2003/0048458 A1 * | 3/2003 | Mieher et al. ............... 356/601 |
| 2003/0121022 A1 * | 6/2003 | Yoshitake et al. ............. 716/21 |
| 2003/0133088 A1 * | 7/2003 | Okita et al. ..................... 355/53 |
| 2004/0239954 A1 * | 12/2004 | Bischoff ....................... 356/635 |

FOREIGN PATENT DOCUMENTS

WO    WO 03/001297 A2    1/2003

OTHER PUBLICATIONS

U.S. Appl. No. 09/765, 148, filed Jan. 17, 2001, Ausschnitt

* cited by examiner

*Primary Examiner*—W. B. Perkey
*Assistant Examiner*—Kevin Gutierrez
(74) *Attorney, Agent, or Firm*—DeLio & Peterson, LLC; Peter W. Peterson; Todd M.C. Li

(57) ABSTRACT

A method of controlling imaging and process parameters in a lithographic process comprises providing a control pattern having an isolated feature with a pitch greater than twice a width of an individual feature, and exposing and developing a calibration resist layer with the control pattern design at a plurality of dose and focus settings. Width of the printed calibration control pattern feature is measured near the top and bottom of the resist layer thickness, and optimum dose and focus settings are then determined. Control patterns are printed at fixed exposure dose and focus settings on a production substrate, and width is measured near the top and bottom of the resist layer thickness. The widths of the production control pattern features are compared with the control pattern model parameters, and the imaging and process parameter settings in the production process are adjusted based on the comparison of the widths.

22 Claims, 7 Drawing Sheets

METHOD OF PATTERNING PROCESS METROLOGY BASED ON THE INTRINSIC FOCUS OFFSET

BACKGROUND OF THE INVENTION

1. Field of the Invention

The present invention relates generally to semiconductor manufacturing and, more particularly, to the characterization and control of lithographic process conditions used in microelectronics manufacturing.

2. Description of Related Art

During microelectronics manufacturing, a semiconductor wafer is processed through a series of tools that perform lithographic processing, usually followed by etch or implant processing, to form features and devices in the substrate of the wafer. Such processing has a broad range of industrial applications, including the manufacture of semiconductors, flat-panel displays, micromachines, and disk heads.

The lithographic process allows for a mask or reticle pattern to be transferred via spatially modulated light (the aerial image) to a photoresist (hereinafter, also referred to interchangeably as resist) film on a substrate. Those segments of the absorbed aerial image, whose energy (so-called actinic energy) exceeds a threshold energy of chemical bonds in the photoactive component (PAC) of the photoresist material, create a latent image in the resist. In some resist systems the latent image is formed directly by the PAC; in others (so-called acid catalyzed photoresists), the photochemical interaction first generates acids which react with other photoresist components during a post-exposure bake to form the latent image. In either case, the latent image marks the volume of resist material that either is removed during the development process (in the case of positive photoresist) or remains after development (in the case of negative photoresist) to create a three-dimensional pattern in the resist film. In subsequent etch processing, the resulting resist film pattern is used to transfer the patterned openings in the resist to form an etched pattern in the underlying substrate. It is crucial to be able to monitor the fidelity of the patterns formed by both the photolithographic process and etch process, and then to control or adjust those processes to correct any deficiencies. Thus, the manufacturing process includes the use of a variety of metrology tools to measure and monitor the characteristics of the patterns formed on the wafer. The information gathered by these metrology tools may be used to adjust both lithographic and etch processing conditions to ensure that production specifications are met. Control of a lithographic imaging process requires the optimization of exposure "dose" and "focus" conditions in lithographic processing of product substrates or wafers.

Lithographic systems consist of imaging tools that expose patterns and processing tools that coat, bake and develop the substrates. The dose setting on the imaging tool determines the average energy in the aerial image. Optimum dose produces energy equal to the resist threshold at the desired locations on the pattern. The focus setting on the imaging tool determines the average spatial modulation in the aerial image. Optimum focus produces the maximum modulation in the image. The settings of many other imaging and processing tool parameters determine the "effective" dose and defocus (deviation from optimum focus) that form the latent image in the resist film. For advanced imaging tools, such as step-and-scan exposure systems, imaging parameters that determine the effective dose and defocus include the dose setting, slit uniformity, mask-to-wafer scan synchronization, source wavelength, focus setting, across-slit tilt, across-scan tilt, chuck flatness, etc. For advanced processing tools, processing parameters that determine the effective dose and defocus include the coat thickness and uniformity, the post-expose bake time, temperature and uniformity, the develop time, rate and uniformity, wafer flatness, topography, etc. Typically, the different imaging and process parameter sources of variation can be distinguished by the spatial signature of the effective dose and defocus variation they cause.

Variation in both imaging and process parameters cause variations in the spatial distributions of effective dose and defocus in the resist film that, in turn, cause variations in the dimensions of the printed patterns. Because of these variations, patterns developed by lithographic processes must be continually monitored or measured to determine if the dimensions of the patterns are within acceptable range. The importance of such monitoring increases considerably as the resolution limit, which is usually defined as minimum features size resolvable, of the lithographic process is approached. The process control objective is to detect and correct imaging and process parameter deviations from the nominal settings that have been determined to produce the desired pattern dimensions. Effective dose and defocus represent a consolidation, into two variables, of the large number of possible imaging and process parameter settings and the large number of possible pattern dimensions. Thus, the measurement and control of the distributions of effective dose and defocus is the most efficient and effective path to the optimization of the patterning process.

As described in U.S. Pat. Nos. 5,953,128; 5,965,309; 5,976,740; 6,004,706; 6,027,842 and 6,128,089, the effective dose and defocus of a lithographic image can be measured using dual-tone optical critical dimension (OCD) metrology; however, as disclosed in U.S. application Ser. No. 09/765,148 by the instant inventor, the dual-tone approach necessitates the use of intentional focus offsets (a.k.a., "canaries") to determine the sign of defocus. Canaries result in undesirable loss of pattern fidelity in focus-offset regions of the wafer. Thus, the problem remains of determining the sign and magnitude of both dose and defocus at each individual measurement site without affecting the patterning fidelity. These requirements would be desirable for an automated dose and focus control method and system.

While published PCT patent application no. WO 03/001297 A2 discloses that the effective dose and defocus of a lithographic image can be extracted from shape parameters such as linewidth, resist height, sidewall angle, top profile, bottom profile or resist loss, the disclosed method of doing so is not generally workable.

SUMMARY OF THE INVENTION

Bearing in mind the problems and deficiencies of the prior art, it is therefore an object of the present invention to provide an improved lithographic system for manufacturing microelectronic circuits.

It is another object of the present invention to provide improved utilization of measurements obtained from CD metrology tools.

A further object of the invention is to provide improved process parameter mapping, monitoring and control in lithographic processing.

It is yet another object of the present invention to provide a control system which provides feedback to the lithography tools.

Still other objects and advantages of the invention will in part be obvious and will in part be apparent from the specification.

The above and other objects, which will be apparent to those skilled in art, are achieved in the present invention which is directed to a method for determining imaging and process parameter settings of a lithographic pattern imaging and processing system. The method comprises correlating the dimensions of a first set of control patterns printed in a lithographic resist layer, measured at two or more locations on or within each pattern that correspond to different optimum focus settings, to the dose and focus settings of the pattern imaging system to produce dependencies. The method then comprises measuring the dimensions on subsequent sets of control patterns printed in a lithographic resist layer at two or more locations on or within each pattern, of which a minimum of two locations corresponding to different optimum focus settings match those measured in the first set. The method subsequently includes determining the effective dose and defocus values associated with forming the subsequent sets of control patterns by comparing the dimensions at the matching locations with the correlated dependencies.

Preferably, each of the control patterns has an isolated feature with a pitch greater than twice a width of an individual or repeating feature in a measurement direction. The measured dimensions of the first and subsequent sets of control patterns may comprise widths of the printed control pattern features as measured at or near the top and bottom of the thickness of the resist layer. The widths at different heights of the subsequent sets of control pattern features may be measured at different locations along the plane of the resist layer, and at different times.

The locations of the different optimum focus settings on or within a pattern preferably correspond to different heights on a profile of the pattern in the resist layer, and one of the heights may comprise a reference height on the profile of the pattern at or near the bottom of the thickness of the resist layer.

The set of control patterns is preferably designed so that the correlated dependencies of its measured dimensions to dose and focus are decoupled from one another.

The method may further include determining the dimensions of the subsequent set of control patterns at all measured and unmeasured locations for which the correlated dependencies have been determined by substitution of the effective dose and defocus values in the correlated dependencies. The correlated dependencies are preferably created using a pre-determined parametric model, which determines optimum dose and focus settings for the pattern imaging system.

The dimensions of the first set of control patterns are preferably measured in a calibration process, and the dimensions of the subsequent set of control patterns are measured in a production process. The dimensions of the subsequent sets of control patterns widths may be converted to deviations of effective exposure dose and defocus, which are then used to adjust the imaging and process parameter settings in the production process.

The method may further include correlating the dimensions of a first set of monitor patterns printed in a lithographic resist layer, measured at one or more locations on or within each monitor pattern, to the dose and focus settings of the pattern imaging system to produce dependencies. This also includes determining the dimensions of any monitor patterns printed simultaneously with the subsequent sets of control patterns, at all locations for which correlated dependencies of the monitor patterns on dose and defocus have been determined, by substitution of the effective dose and defocus values in the correlated dependencies of the monitor patterns.

In another aspect, the present invention is directed to a method of controlling imaging and process parameters in a lithographic process comprising providing a control pattern having an isolated feature with a pitch greater than twice a width of an individual or repeating feature in a measurement direction, and exposing a resist layer having a thickness on a calibration substrate with the control pattern design at a plurality of different exposure dose and focus settings. The exposed resist layer is then developed to produce a calibration resist layer having a plurality of printed control patterns representing different exposure dose and focus settings, each control pattern having at least one printed feature. For each exposure dose and focus setting, the method then includes measuring width of the printed calibration control pattern feature at a plurality of different heights along the thickness of the resist layer, and determining optimum dose and focus settings from the measured widths at different heights of the printed calibration control pattern features and creating control pattern model parameters. The method then comprises printing control patterns at fixed exposure dose and focus settings on a production substrate in a production process, and measuring width of the printed production control pattern features at a plurality of different heights along the thickness of the resist layer. The measured widths at different heights of the printed production control pattern features are then compared with the control pattern model parameters, and the imaging and process parameter settings in the production process are adjusted based on the comparison of the measured widths at different heights of the printed production control pattern features and control pattern model parameters.

On the resist layer calibration substrate, the dose range preferably encompasses a dose sufficient to produce a desired pattern dimension and the focus range encompasses optimum focus settings over a substantial portion of the thickness of the resist layer.

The widths of the printed calibration and production control pattern features are preferably measured at or near the top and bottom of the thickness of the resist layer, at different locations along the plane of the resist layer, and at different times during the process.

The measured widths at different heights of the printed production control pattern features may be converted to deviations of effective exposure dose and focus, and wherein the deviations of effective exposure dose and focus are used to adjust the imaging and process parameter settings in the production process.

The method may further including providing a set of one or more monitor patterns and exposing and developing the resist layer to print a plurality of calibration monitor patterns and one control pattern representing different exposure dose and focus settings in the resist layer. For each exposure dose and focus setting, the method then includes measuring width of the printed calibration monitor pattern features and the printed control pattern feature at a plurality of different heights along the thickness of the resist layer. Optimum dose and focus settings are determined from the measured widths at different heights of the printed calibration monitor and control pattern features and monitor and control pattern model parameters are created. The method subsequently includes printing control and monitor patterns at fixed exposure dose and focus settings on a production substrate in a production process, and computing the widths of the monitor pattern features at the plurality of heights for which model parameters have been determined. The imaging and process parameter settings in the production process are adjusted based on comparison of the measured widths of the control patterns and the computed widths of the monitor patterns and their dependencies on dose and focus.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
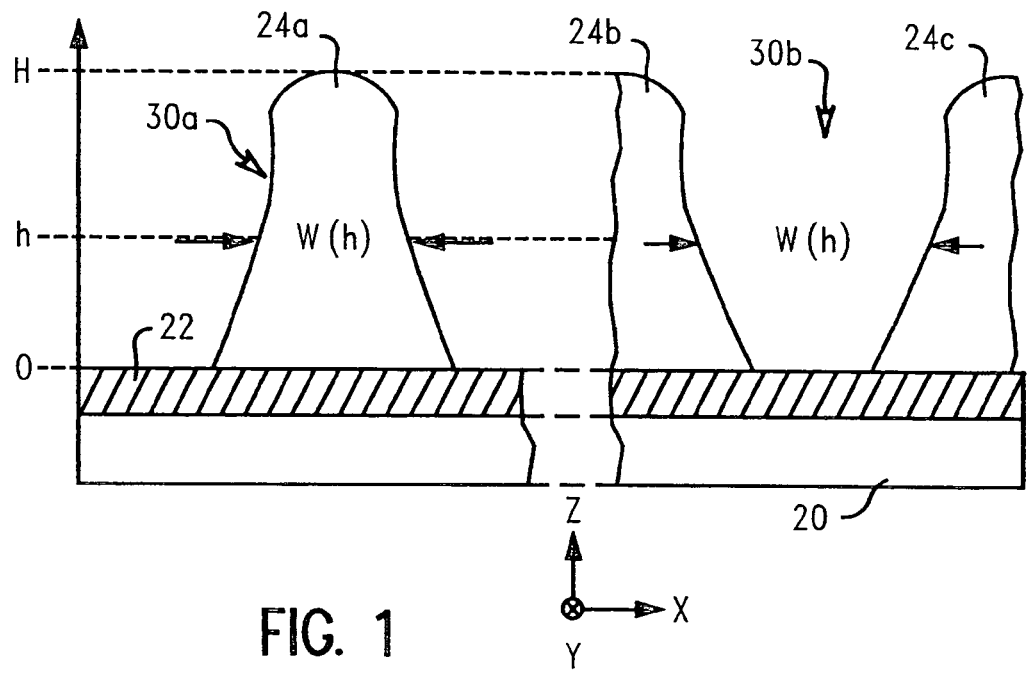
FIG. 1 is a side elevational view of the profile of shape and space patterns in a resist layer which are measured in the present invention.

In describing the preferred embodiment of the present invention, reference will be made herein to FIGS. 1–11 of the drawings in which like numerals refer to like features of the invention.

The inventive method for determining the imaging and process parameter settings of a lithographic pattern imaging and processing system exploits the focus offset intrinsic to a pattern formed in a film of finite thickness in an analytic model of two or more dimensional measurements that extracts the effective dose and defocus of the imaging system and process used in forming the pattern. Without additional measurement, the inventive method further enables simultaneous computation of all pattern dimensions pre-calibrated to the imaging system dose and focus settings.

The inventive method distinguishes two categories of measurable patterns. A first type of pattern, referred to herein as a "control pattern," is a process compatible pattern optimized for subsequent in-line determination of effective dose and defocus. The control pattern should exhibit high CD or width sensitivity to dose and focus over the range of process variation, negligible coupling between dose and focus, and negligible asymmetry in its focus response. (The smallest width of a shape or space that can be formed by the lithographic process is known as the critical dimension or CD). The control pattern can be a target specifically designed to satisfy the above criteria, or a section of an actual circuit pattern to be made in production, but it is not guaranteed that circuit patterns will make the best control patterns. In particular, as shown below, the preferred control pattern elements are so-called "isolated" features—i.e., features whose pitch relative to neighboring patterns is much greater than twice their width. The other type of measurable pattern is referred to herein as a "monitor pattern," which is any other process compatible pattern, including any of the circuit patterns.

A preferred embodiment of the inventive method employs CD or width measurements at two or more heights on the control pattern profile. In cross-section, the profile of a symmetric pattern is described by its width W as a function of height $0 \leq h \leq H$, as illustrated for both tones of a pattern cross-section in FIG. 1. Substrate layer 22 on wafer 20 has disposed over it a resist layer, which has been exposed with a pattern and developed to print a resist shape 30, comprising profiled resist layer portion 24a and a resist space 30b, comprising a profiled space between resist layer portions 24b, 24c. Shape 30a and space 30b have widths that generally vary with height, so that W(h) designates the width of the shape or space at height h. Since the profile of shape 30a and space 30b is dictated by the process, the method of the present invention specifies a desired width $W=W_0$ at a specific height $h=h_0$, which is referred to as the "reference height." Because of the need for subsequent pattern transfer by etch or implant in semiconductor applications, the reference height is preferably chosen to be at or near the resist-substrate interface, $h=0$. Measurement of the pattern or feature dimensions may be made by SEM, AFM, optical microscopy, scatterometry, reflectometry, or diffractometry.

The CD or width W at the reference height establishes the dose $E_0$ at the best focus $Z_0=Z_B(h_0)$ for that height, where best focus $Z_B(h)$ at each height is defined as the focus setting at which the rate of change of CD with focus is zero:

Equation (1):

$$\left.\frac{\partial W}{\partial Z}\right|_{Z=Z_B(h)} = 0$$

Figure 2:
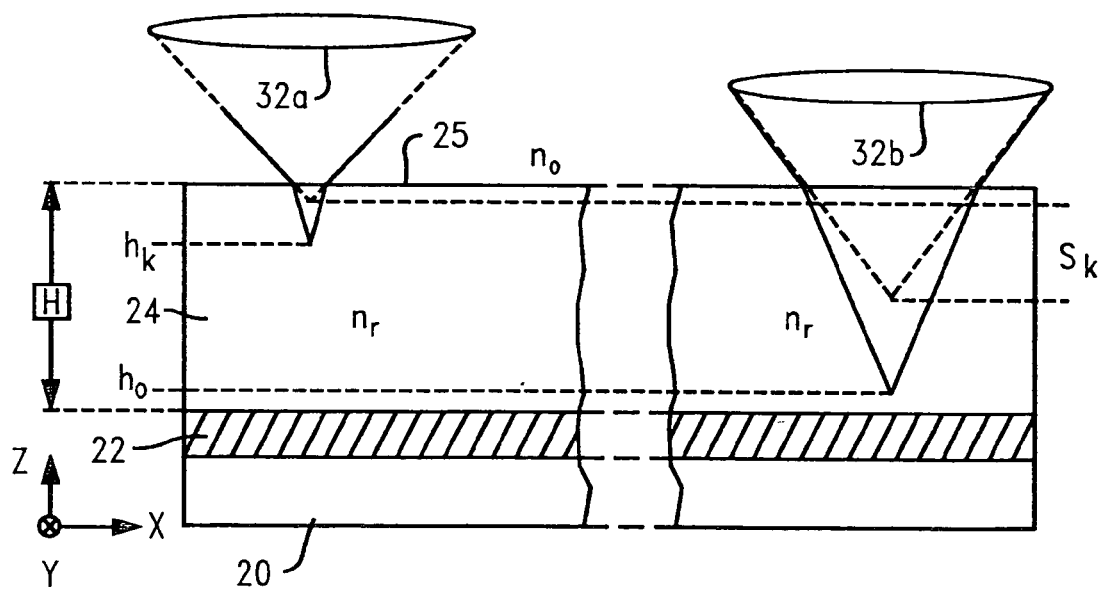
FIG. 2 is a side elevational view of a resist layer showing intrinsic focus offset while accounting for the refraction of the light rays at the upper resist interface.

As illustrated in FIG. 2, the best focus position in the resist layer varies with height. Being closer to the imaging lens, best focus near the top of a resist film 24 of finite height, H, will always occur at focal plane shifted toward the imaging lens. Imaging lenses 32a, 32b pass the aerial image downward into resist layer 24. For uniform media, the refraction of the rays at the upper resist interface 25, as shown in FIG. 2, results in an intrinsic focus shift $S_k$ between a sampled location $h_k$ and the reference location $h_0$ at or near the resist-substrate interface:

Equation (2):

-continued $$S_k \equiv Z_B(h_k) - Z_0 = (h_k - h_0)\frac{n_0}{n_r}$$

that is linearly proportional to the distance from the reference height, where $n_o$ is the refractive index of the medium between the imaging lenses 32a, 32b and the resist layer 24, and $n_r$ is the refractive index of the photoresist material.

The CD variation dependence on dose and focus at each sampled height can be expressed as a series expansion in the dose and focus settings (E, Z) of the exposure tool. The center of expansion in dose is fixed at $E_0$ for all pattern heights, as determined by the designation of $W_0$ at $h_0$; however, the center of expansion in focus is the best focus position for each height $Z_B(h)$, which varies according to Equation (2). In the neighborhood of the dose and focus settings ($E_0$, $Z_0$) that produce the desired width $W_0$ at the height $h_0$, the expansion is:

Equation (3):

$$W(h_k) = \sum_{m=0}^{M}\sum_{n=0}^{N} a_{nmk}\left(1 - \frac{E_0}{E}\right)^n (Z - Z_0 - S_k)^m$$

The above expansion is a generalized parametric model of CD response to dose and focus for patterns of any type, where "type" is defined by attributes such as tone (e.g., space or shape), density (e.g., nested or isolated), and aspect (e.g., rectangular or square). The $a_{mnk}$ coefficients are pattern type dependent. In the case of monitor patterns, for which an inverse model is not required, the full expansion in Equation (3) can be the model, although the higher order terms for which N>2, M>4, and N+M>4 are usually negligible. To ensure an analytic form for the inverse model required by the control patterns, however, one preferably should truncate the independent terms at N=M=2, the coupling terms at N+M=3 and assume the focus asymmetry terms $a_{n1k}$ are negligible, so that Equation (1) reduces to:

Equation (4):

$$W(h_k) \approx a_{00k} + a_{10k}\left(1 - \frac{E_0}{E}\right) + a_{20k}\left(1 - \frac{E_0}{E}\right)^2 a_{02k}(Z - Z_0 - S_k)^2 + a_{12k}\left(1 - \frac{E_0}{E}\right)(Z - Z_0 - S_k)^2$$

For an imaging system with reasonably low aberration, Equation (4) still describes the primary dependence of most pattern types. The optimum dose and focus settings ($E_0$, $Z_0$) are those that produce a pre-specified CD $a_{000}=W_0$ at the pre-specified height $h_0$ with the largest depth of focus, the focus at which the rate of change of CD with focus is zero, as expressed in Equation (1). The process-intrinsic height-dependent parameters denoted by the subscript k have the following physical definitions:

$S_k$: Intrinsic focus offset $a_{00k}$: CD at height $h_k$, optimum dose $E_0$ and focus $Z_0+S_k$.

$a_{10k}$: Dose sensitivity at height $h_k$, rate of change of CD with dose (the inverse of exposure latitude).

$a_{20k}$: Rate of change of dose sensitivity with dose at height $h_k$.

$a_{02k}$: Defocus sensitivity at height $h_k$, rate of change of CD with the square of defocus (inversely proportional to depth of focus).

$a_{12k}$: Coupling between dose and defocus at height $h_k$.

For each pair of heights $h_0$, $h_k$ on the profile, the above parameters can be determined by a least-squares fit to the measurements $W(h_0)$, $W(h_k)$. Over many samples of $h_k$, the resulting constants $E_0$, $Z_0$ and functions $a_{nm}(h)$, $S(h)$ are the primary characteristics of the imaging process for each measured pattern type.

Included in the pre-characterized pattern types should be at least one control pattern. As noted above, the control pattern should exhibit high CD sensitivity to dose and focus over the range of process variation, negligible coupling between dose and focus, and negligible asymmetry in its focus response. Specification of the control pattern is primarily dictated by the relationship between the parameters $a_{02k}$, $a_{12k}$ in Equation (4) that govern focus dependence. In general, these parameters are only weakly dependent on height, so that the k subscript can be dropped. It should be noted that the last two terms of Equation (1) allow the existence of a so-called isofocal point in the pattern formation, a dose at which the pattern CD is independent of defocus:

Equation (5):

$$E_{isofocal} = \frac{E_0}{1 - \frac{a_{02}}{a_{12}}}$$

Figure 3:
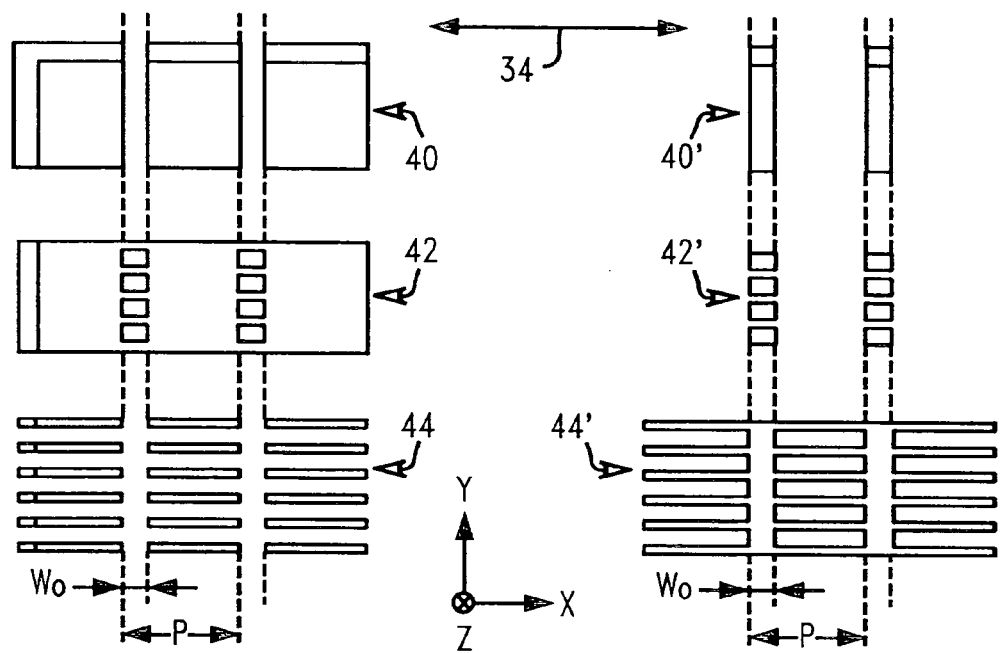
FIG. 3 is a top plan view of patterns in a resist layer which are isolated in the measurement direction, i.e., they have a pitch much greater than twice the width of the smallest feature being measured.

For nested patterns (periodic patterns whose pitch P is approximately equal to twice their nominal width $W_0$), $a_{12} \gg a_{02}$, $E_{isofocal} \approx E_0$ and the dose-defocus coupling term of Equation (4) must be included. While this makes the nested pattern desirable from the perspective of focus latitude, it is undesirable as a control pattern, since it has little focus sensitivity. For isolated patterns (P>>2 $W_0$), however, the dose-defocus coupling term is negligible ($a_{12}=>0$). Thus, focus sensitivity is ensured by the fact that $E_{isofocal}$ is no longer comparable to $E_0$, and isolated patterns are a suitable control pattern embodiment. Examples of isolated pattern layouts appropriate for the inventive method are shown in FIG. 3, where there are shown patterns isolated in the measurement direction, i.e., patterns which have a pitch much greater than twice the width of the smallest feature being measured in direction 34. These patterns include trench pattern 40, contact or trench segment pattern 42, and line end pattern 44, which measure the width $W_0$ of spaces between shapes in the resist layer, and also line pattern 40', post or line segment pattern 42' and trench end pattern 44', which measure the width $W_0$ of shapes between spaces in the resist layer. The patterns 40', 42', 44' are the respective tone complements of patterns 40, 42, 44. For isolated patterns, the simultaneous equations for the widths at two or more heights on a pattern profile simplify to:

Equation (6):

$$W(h_k) \approx a_{00k} + a_{10k}\left(\frac{E_0}{E} - 1\right)\left[1 + r_0\left(\frac{E_0}{E} - 1\right)\right] + a_{02k}(Z - Z_0 - S_k)^2$$

where there is made the further reasonable assumption that $r_0 \equiv a_{20k}/a_{10k}$ is independent of k. In the case where measurements are made at only two heights $h_0$, $h_1$, near the bottom and top of the profile, the set of simultaneous equations governing CD response to dose and focus becomes:

$$W_{bot} \approx W_0 + a_{100}(D + r_0 D^2) + a_{020} F^2$$

$$W_{top} \approx a_{001} + a_{101}(D + r_0 D^2) + a_{021}(F^2 - 2S_1 F + S_1^2) \quad \text{Equation (7a, 7b):}$$

where the dose and focus deviations from optimum are defined as:

Equation (8a, 8b):

$$D \equiv 1 - \frac{E_0}{E}$$

$$F \equiv Z - Z_0$$

The intrinsic focus offset S1 introduces a term in Equations (7) that is linear in F.

Figure 4:
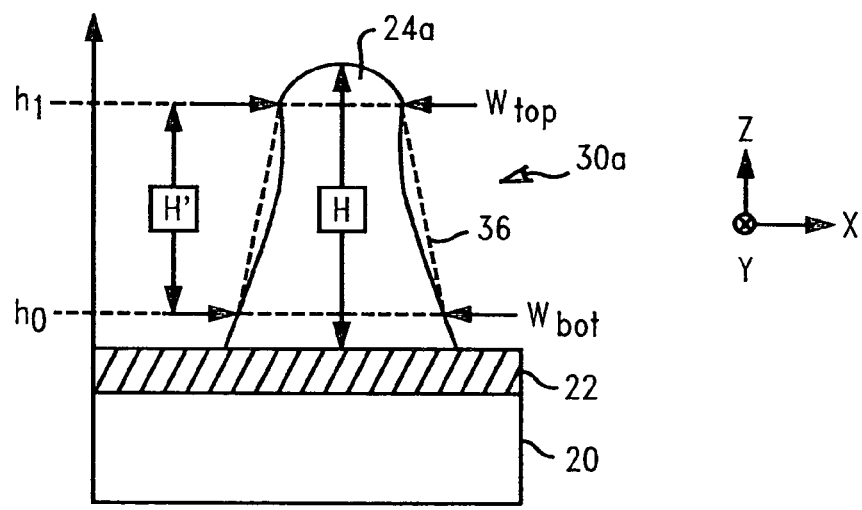
FIG. 4 is a side elevational view of the approximation of a shape pattern profile of the type shown in FIG. 1 as a trapezoid.
Figure 5:
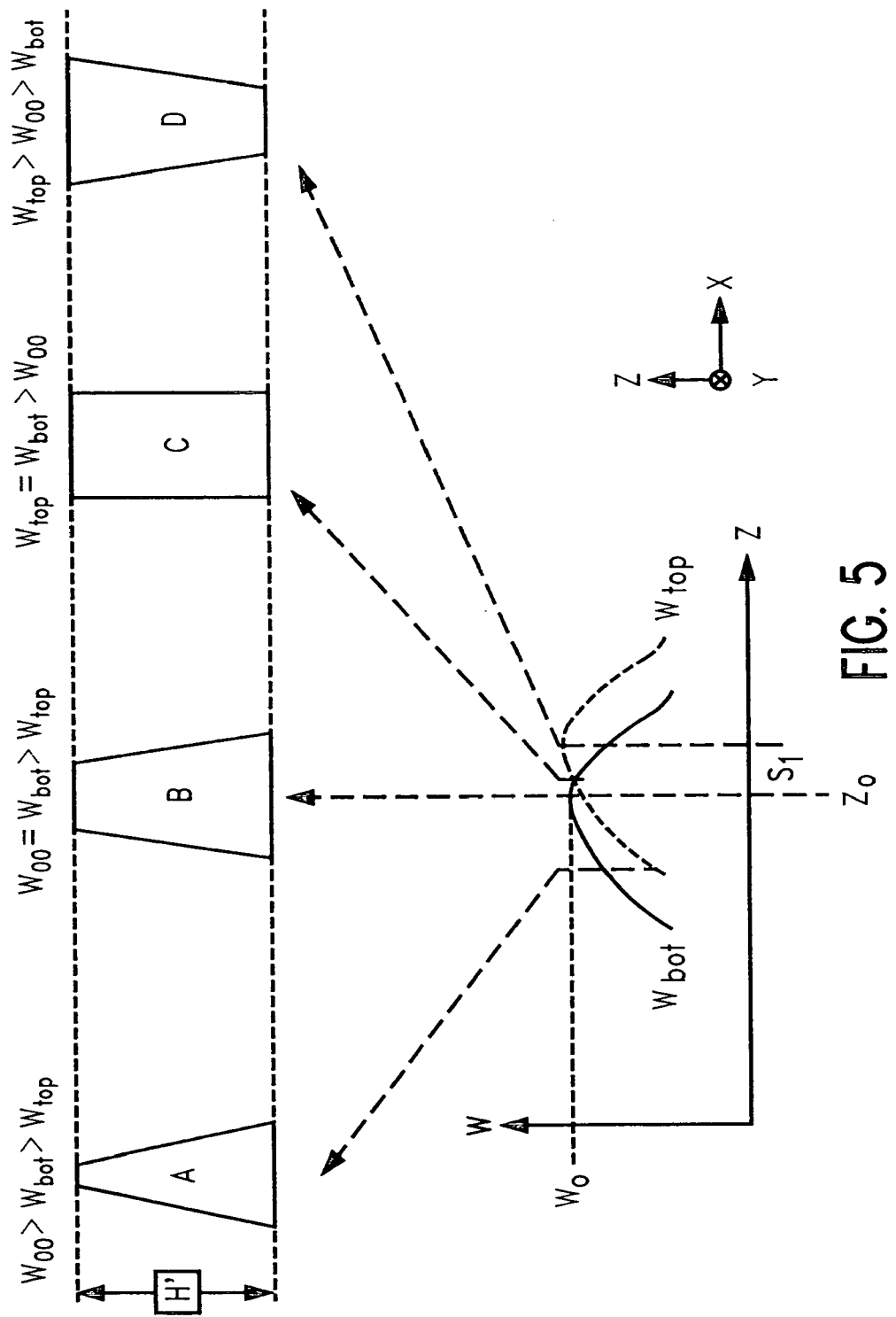
FIG. 5 is a graphical representation of the through focus behavior of bottom and top widths for different pattern profiles.

The top and bottom widths approximate the pattern profile by a trapezoid 36, as shown in dotted lines in FIG. 4. An example of the through focus behavior described by Equations (7) is shown in FIG. 5. The plot in FIG. 5 shows the through focus variation of the bottom width $W_{bot}$ (solid line) and top width $W_{bot}$ (dotted line). At optimum focus for the bottom of the resist film $Z_0$, $W_{bot} = W_0$. The separation of the peaks of the two curves is the intrinsic focus shift $S_1$. The plot of FIG. 5 also depicts the trapezoidal cross-sections of the corresponding pattern profiles, A, B, C and D. Having vertical sidewalls, the "ideal" rectangular cross-section C occurs if and where the curves intersect. Depending upon the demands of the subsequent etch or implant pattern transfer, different approaches to process optimization can be taken. For the process shown, profile C occurs where $W_{bot} = W_{top} > W_0$.

Figure 6:
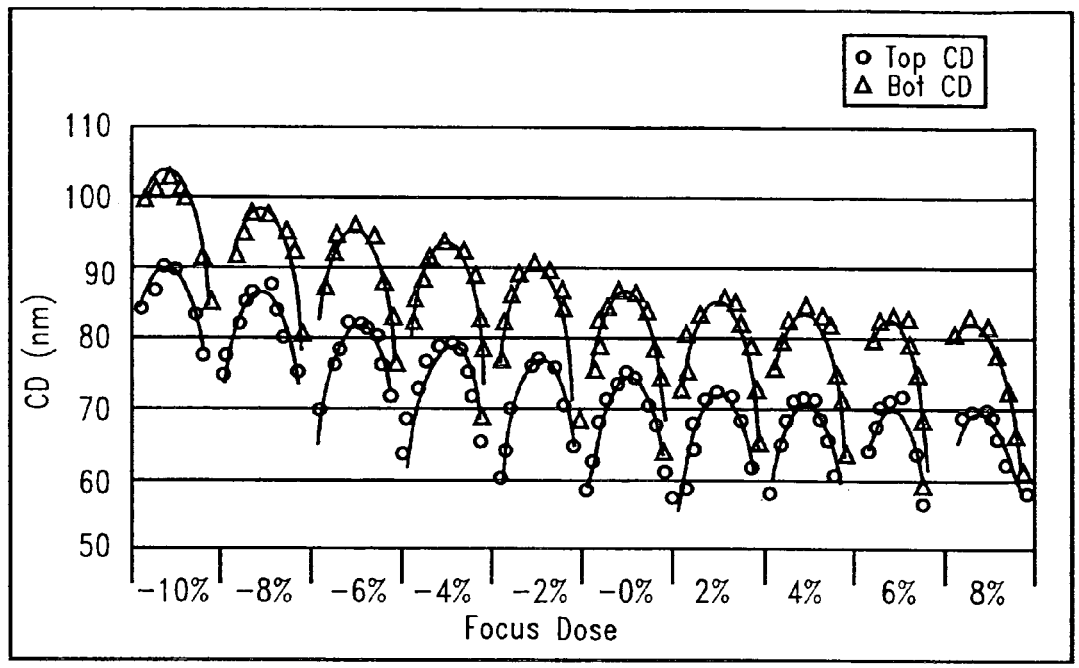
FIGS. 6 and 7 are graphical representations of the measured values of the top and bottom widths of a pattern profile through a range of lithographic exposure dose and focus values.
Figure 7:
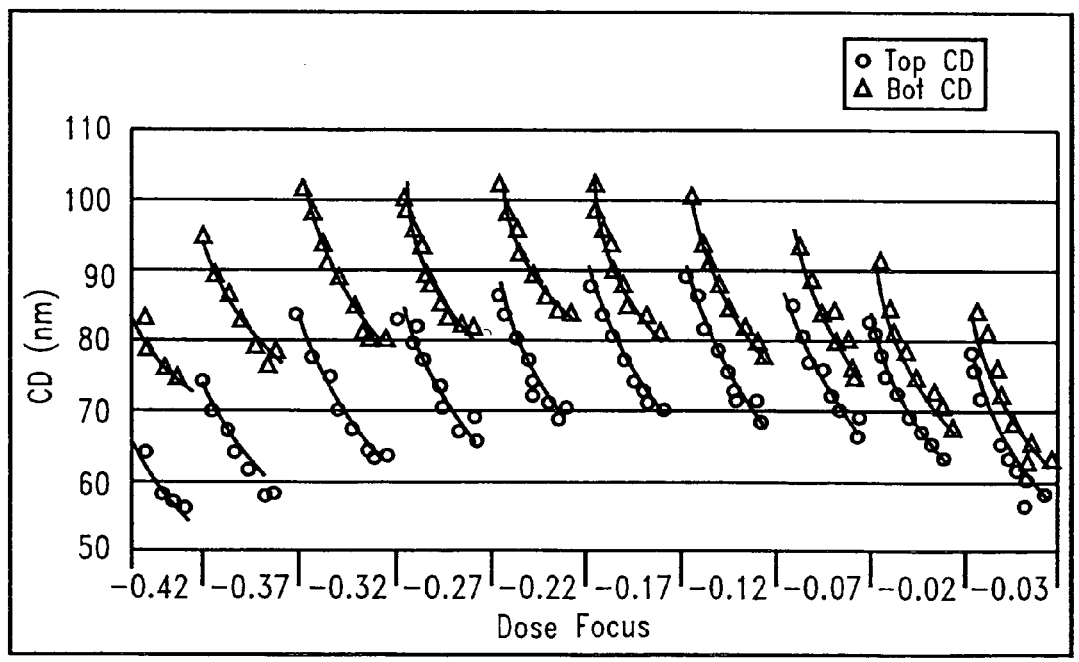

For a given patterning process, the various parameters of Equations (7) can be determined by a least-squares fit to measured values of the top and bottom widths through a range of dose and focus values. An example of such a fit is shown in FIGS. 6 and 7, for the case where the top and bottom widths of a focus-exposure matrix (FEM) were measured by a TEL iODP reflectometer on a grating target consisting of nominal 90 nm lines at 595 nm pitch (this meets the isolated criteria since $P > 6 W_0$) printed by a 193 nm exposure tool in 200 nm thick positive resist. The range of dose settings was approximately +/−10% about a nominal setting of 25 mJ/cm² in increments of 2%. The range of focus settings was from −0.42 μm to 0.03 μm in increments of 0.05 μm. The individual control patterns having the isolated features were arrayed along the resist layer, that is, along the x-y plane, with a different combination of exposure dose and focus setting at each control pattern location. The discrete data points in both figures are the measured widths, the continuous lines are the fit of Equations (7) to the measured values of $W_{bot}$ and $W_{top}$. In general, an excellent fit of the model to the data is observed, with a residual standard deviation over the entire data set <1 nm. The same data is presented in both figures, but the ordering of dose and focus on the x-axis is reversed. FIG. 6 shows for each top and bottom CD pair the focus characteristics of the width within a particular dose increment. The curves exhibit the defocus characteristics of well-isolated features; namely, their dimensions decrease monotonically from the maxima that define optimum focus. The intrinsic focus offset is apparent in the dose-independent shift of the $W_{top}$ maxima relative to the $W_{bot}$ maxima. FIG. 7 shows for each top and bottom CD pair the dose characteristics of the width within a particular focus increment. As to be expected in positive resist, the CD decreases monotonically with increasing dose within each focus increment. As the model predicts, the CD decrease with dose is far from linear. Since the bottom width is always bigger than the top width for this particular process (i.e., the curves never cross), the measured profile is tapered outward throughout the dose and focus range. Nonetheless, the sidewall angle increases with increasing focus, such that it is nearly 90° at the extreme focus setting of 0.031 μm. This is far removed from the optimum focus setting dictated by Equation (1) and enumerated in Table I below. Thus, sidewall acuity alone has been found to be a poor indicator of the optimum focus setting.

Given the desired nominal CD at the resist bottom, $W_0 = 90$ nm, the fitted parameters that govern the solid curves in FIGS. 6 and 7 are summarized in Table 1 below:

TABLE 1

| Param | Value | Units | Definition |
|---|---|---|---|
| $W_0$ | 90 | nm | Specified target value of $W_{bot}$ |
| $E_0$ | 24.3 | mJ/cm² | Dose at which $W_{bot} = W_0$ at $Z_0$ |
| $Z_0$ | −0.224 | μm | Best focus at the reference height $h_0$ |
| $r_0$ | −3.32 | — | Relative rate of change of dose sensitivity with dose |
| $S_1$ | 0.053 | μm | Intrinsic focus offset between $h_1$ and $h_0$ |
| $a_{100}$ | −132 | nm | $W_{bot}$ dose sensitivity per $E_0$ dose change |
| $a_{020}$ | −316 | nm/μm² | $W_{bot}$ focus sensitivity per micron defocus |
| $a_{001}$ | 77.3 | nm | $W_{top}$ dimension at $E_0$ and $Z_0 + S_1$ |
| $a_{101}$ | −122 | nm | $W_{top}$ dose sensitivity per $E_0$ dose change |
| $a_{021}$ | −275 | nm/μm² | $W_{top}$ focus sensitivity per micron defocus |

The models for CD as a function of height on the pattern profile can be inverted to solve for the effective dose and defocus seen by the printed pattern as functions of the measured CDs. For CDs measured on any pre-calibrated pattern, the general model for CD Equation (3) can be numerically inverted to solve for the corresponding effective dose and defocus; however, a solution is not guaranteed. If one restricts attention to control patterns whose response is described by Equation (7), however, the analytical solution is straightforward. The equations can be rearranged into pair of quadratic equations in the effective dose and defocus (E', F'):

$$A_f F'^2 + B_f F' + C_f = 0$$

$$A_d D'^2 + B_d D' + C_d = 0 \quad \text{Equation (9a, 9b):}$$

where:

Equation (10a, b, c, d, e, f):

$$A_f \equiv a_{021} - \frac{a_{020}}{a_{100}} a_{101}$$

-continued $$B_f \equiv -2a_{021}S_1$$

$$C_f \equiv \frac{a_{101}}{a_{100}}(W_{bot} - W_0) + a_{021}S_1^2 - (W_{top} - a_{001})$$

$$A_d \equiv a_{100}r_0$$

$$B_d \equiv a_{100}$$

$$C_d \equiv a_{020}F'^2 - (W_{bot} - W_0)$$

Effective dose and defocus are then given by the well-known quadratic solutions:

Equation (11a, 11b):

$$F' = \frac{-B_f \pm \sqrt{B_f^2 - 4A_fC_f}}{2A_f}$$

$$D' = \frac{-B_d \pm \sqrt{B_d^2 - 4A_dC_d}}{2A_d}$$

and finally:

Equation (12):

$$E' = \frac{E_0}{1 - D'}$$

For a given pattern and process, the signs of the square root terms in Equations (11a, b) are determined by matching the direction of the derived effective dose and defocus increase to the direction of increasing dose and focus inputs at calibration. For the data set modeled in FIGS. 6 and 7, the negative sign is correct in Equation (11a) and the positive sign is correct in Equation (11b).

Possible degenerate cases are also readily solved. In the case of a process for which the top and bottom dose and focus sensitivities are equal ($a_{100}=a_{101}$ and $a_{020}=a_{021}$), Equation (11a) simplifies to:

Equation (13):

$$F' = \frac{W_{bot} - W_{top} - (W_0 - a_{001}) - a_{021}S_1^2}{2S_1a_{021}}$$

In the case where the dose dependence is purely hyperbolic ($r_0=0$), Equation (8b and 9) simplify to:

Equation (14):

$$E' = \frac{a_{100}E_0}{a_{100} - (W_{bot} - W_0 - a_{020}F'^2)}$$

Figure 8:
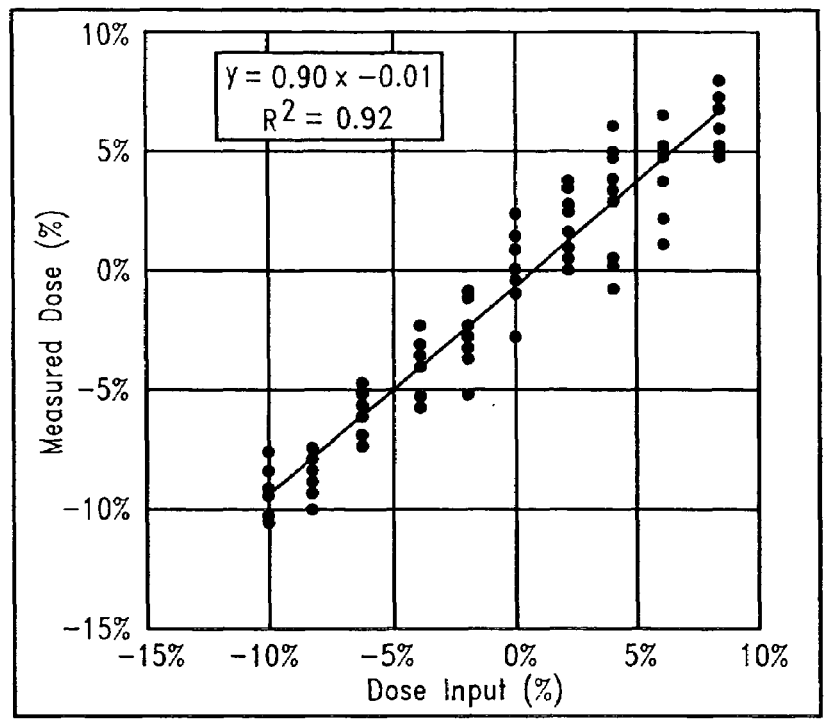
FIGS. 8 and 9 are graphical representations of the measured effective dose and defocus values plotted against the input settings to the lithographic exposure tool.
Figure 9:
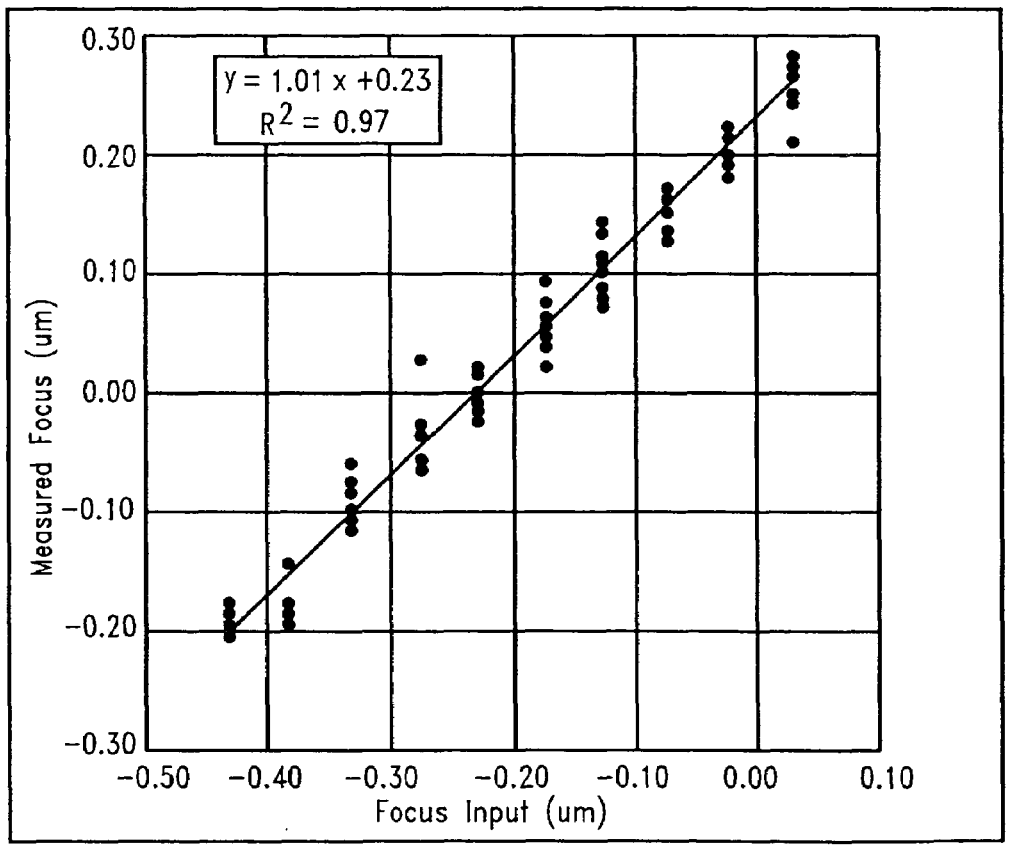

For the fitted parameters of Table 1, the application of the inversion Equations (10, 11, 12) to the same CD data shown in FIGS. 6 and 7 results in the measured effective dose and defocus values shown in FIGS. 8 and 9 plotted against the input settings to the exposure tool. The measured values of effective dose and defocus follow the same trend as the input settings to the exposure tool with slopes comparable to unity (in this case, within 10% for dose and 1% for focus). The observed scatter in FIGS. 8 and 9 can be attributed to a combination of measurement noise, modeling error, and the variations of effective dose and defocus on the measured wafer does not correlate to the systematic FEM adjustment of the tool settings. Independent studies of measurement precision and examination of the distribution of modeled residuals indicate that the latter is the dominant cause of scatter. Thus, the inventive method serves as a process diagnostic on the calibration wafer itself. The calibration can be further optimized by process optimization in the patterning of the FEM.

Figure 10:
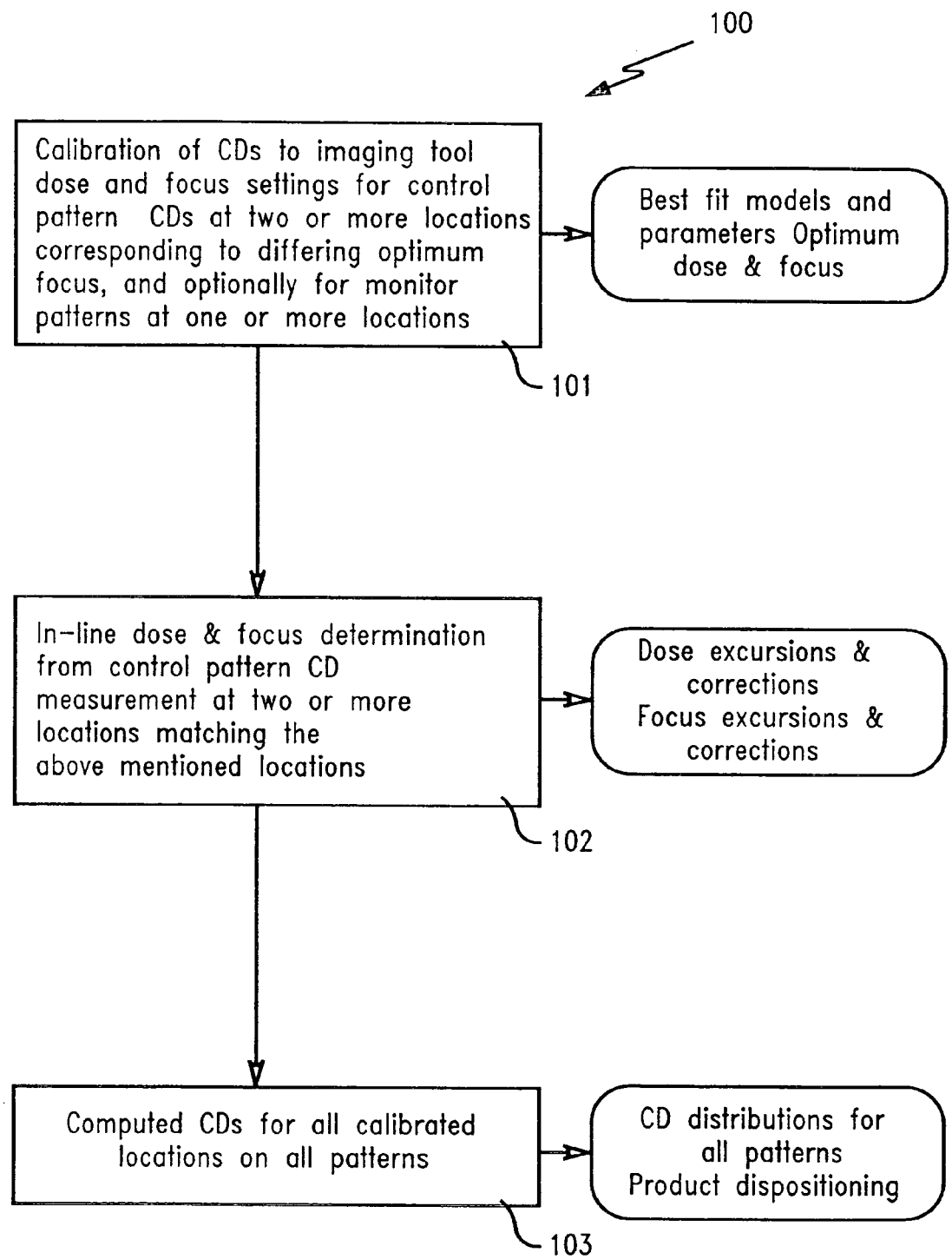
FIG. 10 is a flow chart showing the generalized, high level method of determining imaging and process parameter settings of a lithographic pattern imaging and processing system, in accordance with the present invention.

A general flowchart 100 of the method of the present invention is shown in FIG. 10. The control patterns printed in a resist layer are calibrated 101 by correlating, at two or more locations along the resist layer (corresponding to differing optimum focus settings, the dimensions to different exposure dose and focus settings, e.g., by measuring widths in isolated features at different heights at the different settings. Optionally, the same is done for printed monitor patterns at one of more locations along the resist layer. The calibration step 101 serves to define the relevant terms and parameters in the general model of Equation (3). Calibration at a single point in time suffices for stable processes. Two of the model parameters are the optimum settings for dose and focus. The subsequent step 102, determining effective dose and defocus based on in-line process measurements of the control patterns, enables tracking of the temporal and spatial variation of dose and defocus. Excursions can be corrected by feedback to the lithography imaging and process tools or feedforward to etch or implant tools. Corrections will typically require the application of conventional spatial or temporal models to translate the dose and defocus excursions to the adjustment of particular tools and processes. In some cases an additional calibration step will be required to determine the appropriate conversion factors. The final step 103, the computation of CDs, leverages the dose and defocus values determined in the previous step to determine the in-line CD values for all pre-calibrated locations on all patterns. Thus, two measurements on the control pattern become equivalent to a potentially unlimited number of measurements on a wide variety of patterns, thereby minimizing in-line measurement time and suppressing the effects of measurement error. The method of the present invention provides a powerful tool to validate the adherence of all pattern dimensions to acceptable tolerances in dispositioning the manufactured product.

Figure 11:
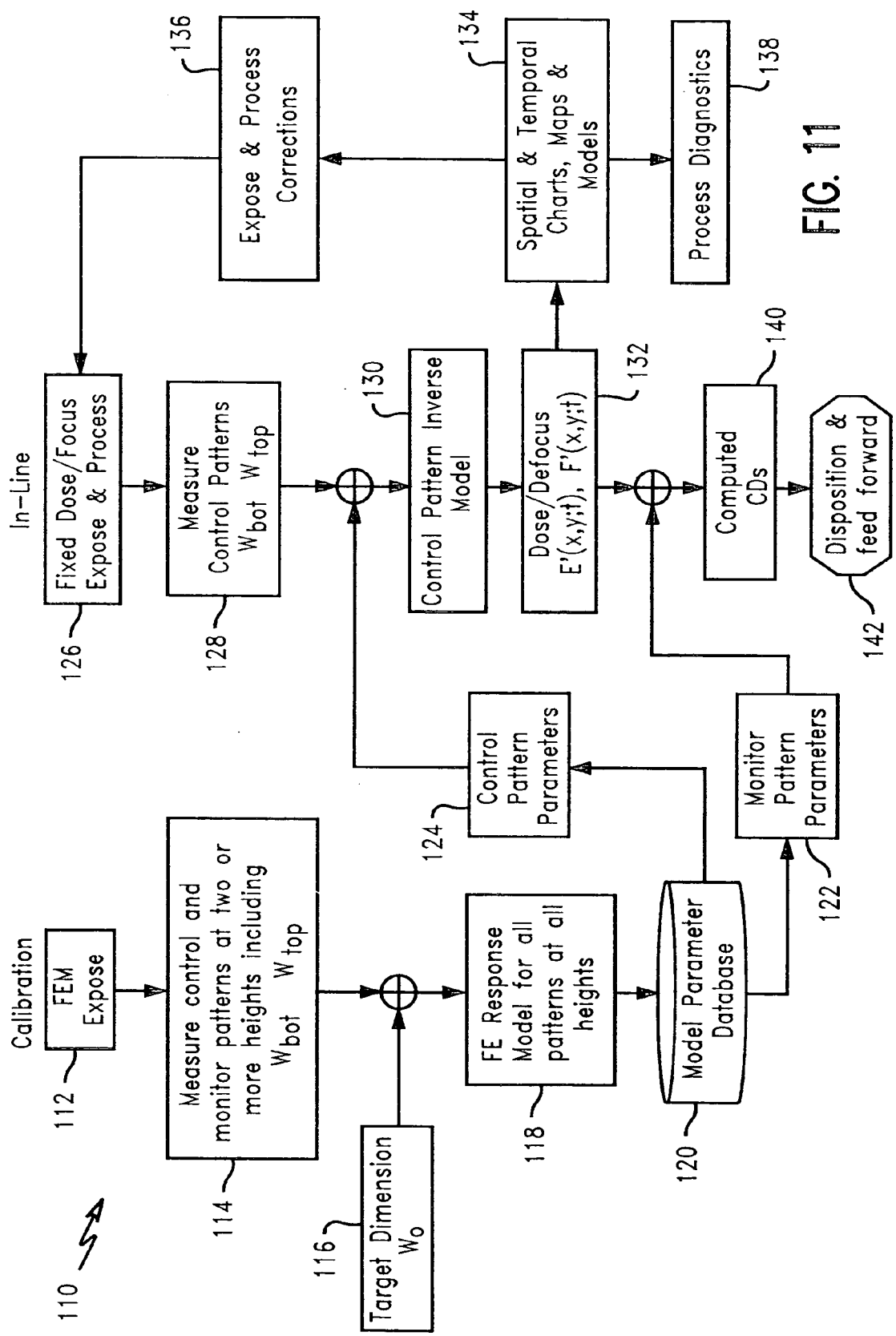
FIG. 11 is a flow chart showing the preferred detailed method of determining the imaging and process parameter settings in accordance with the present invention.

A detailed flowchart 110 of the inventive method is shown in FIG. 11. The steps are as follows for both the calibration and in-line, production portions of the method:

Step 112. In the initial calibration portion of the process, print a pattern comprised of one or more control pattern designs and any number of monitor pattern designs in a resist film of finite thickness over a range of imaging tool dose and focus settings. The dose range encompasses the dose required to produce the pre-specified desired pattern dimension. The focus range encompasses the optimum focus settings over a substantive portion of the thickness of the resist film.

Step 114. At each dose and focus setting, measure CD at two or more locations within the control pattern corresponding to different optimum focus settings of the imaging tool, typically two or more heights on the profile of one control pattern and preferably at or near the top and bottom of the resist $W_{top}$, and $W_{bot}$. Optionally, at each dose and focus setting, measure CD at one or more locations within one or more monitor patterns, typically at one or more heights of the profiles of each of selected subset of the monitor patterns.

Step 116. Input the target CD $W_0$ for one of the locations measured on the control pattern, typically the reference height.

Step 118. Calibrate the CD measurements of the control and monitor patterns to the dose and focus settings of the imaging tool using a parametric model, e.g., Equation (3). Determine the optimum dose and focus settings and the focus-exposure (FE) model parameters by a best fit of the model to the CD measurements.

Step 120. Store the optimum dose and focus settings and the control and monitor model parameters in a database labeled by process identifiers, pattern identifiers, and location (typically height) identifiers.

Step 126. Subsequently, during the in-line or production lithographic process, print patterns comprised of one or more of the same control pattern designs and, optionally, one or more of the same monitor pattern designs using a similar process at fixed dose and focus settings known to fall near or within the calibrated range.

Step 128. Measure CD at the control pattern locations corresponding to the calibrated locations, typically the matching heights of the profiles that are preferably at or near the top and bottom of the resist $W_{top}$, and $W_{bot}$.

Step 130. Convert the CD measurements on the control pattern to deviations of the effective dose and defocus by retrieving the appropriate control pattern model parameters 124 from the database created in Step 120, and substituting each site- and pattern-specific set of CD measurements and the associated optimum settings and model parameters into the inverse of the model in Step 118. The result is Step 132 which provides a set of dose and defocus values E'(x,y;t) and F'(x,y;t) distributed spatially and temporally according to the measurement sampling. Sampling is limited only by the placement of the control patterns and the time available for measurement. The spatial and temporal distributions may be across the exposure field, across the wafer, from wafer to wafer, and across groups of wafers (lot-to-lot). The temporal distribution is preferably ordered by processing time.

Step 134. Following generation of the set of dose and defocus values from the measurement sampling, various charts and maps of the dose and defocus distributions can be generated for visualization. Conventional tool and process specific models can be applied to extract lithographic tool and process corrections from the distributions. The spatial models applied for dose and defocus corrections are straightforward geometry-based fits, given that the original calibration is to dose and focus. Examples include corrections to average dose, slit and scan dose uniformity, average focus, and slit- and scan-focus tilts. Models applied to the correction of other process parameters may require an auxiliary calibration step (not shown). For example, the correlation of post-exposure bake temperature to effective dose in many resist processes is well known; however, a calibration is required to establish the quantitative relationship for each resist process. Conventional temporal models may be applied to the sequence of pattern exposures to determine corrections to the dynamics of imaging and process parameters.

Step 136. Looping back to the production expose and process step 1 26 are the in-line correction feedback signals for the imaging and process parameters in subsequent processing.

Step 136. A process diagnostics step may follow the step 134 generation of the various charts and maps of the dose and defocus distributions. Such diagnostics include excursions for which dynamic corrections may not be possible, but which indicate degradation in process performance. For example, localized dose or defocus excursions, so-called "hotspots," often indicate exposure chuck contamination. The corrective action in this case is to cease processing until the chuck is cleaned.

Step 140. Returning to the production process, the next step is to convert the effective dose and defocus values determined in Step 1 32 to CD distributions for all of the pre-calibrated control and monitor pattern locations by retrieving the appropriate control pattern 124 and monitor pattern 122 model parameters from the database created in Step 120, and substituting each site- and pattern-specific set of dose and focus values and the associated focus-exposure model parameters into the model created in Step 118.

Step 142. Disposition product based on CD tolerances established by correlating the CD distributions of Step 140 to the ultimate circuit performance. Feedforward corrections to subsequent processing steps, such as etch or implant, to further reduce any residual CD errors.

The inventive method can be applied to measurements using a variety of metrology techniques, for example, SEM, AFM, optical microscopy, scatterometry, reflectometry, and diffractometry, provided the same technique or correlated techniques are employed for the control pattern in the calibration and in-line measurement phase (Steps 114 and 128).

Thus, the present invention provides an improved method for determining imaging and process parameter settings in a lithographic system, particularly for manufacturing microelectronic circuits. Using measurements obtained from CD metrology tools, the instant method provides improved process parameter mapping, monitoring and control in lithographic processing, which may be used to provide in-line feedback control of the lithography tools, or feedforward corrections to subsequent processing steps. The advantages of the inventive method over the prior art are that it:

1. determines the sign and magnitude of defocus with each measurement using the intrinsic focus offset—there is no need for intentional offsets introduced by the tool or process.

2. requires in-line measurement of only a single control pattern (isolated pattern preferred, dual-tone not required), but enables simultaneous determination of an unlimited number of monitor pattern CDs for which calibration has been performed; thereby minimizing the in-line measurements required for tracking multiple pattern types.

3. creates calibration models applicable to all pattern types, based on a series expansion in dose and focus, that summarizes process characteristics with a minimum number of parameters by appropriate series truncation.

4. enables analytic model inversion by using control patterns comprised of isolated features.

5. works with all dimensional metrology tools capable of profile measurement.

6. improves CD metrology by using the pre-calibrated modeled process characteristics to filter CD measurement noise.

7. applies to in-line measurement and off-line detailed process characterization and control.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for determining imaging and process parameter settings of a lithographic pattern imaging and processing system, the method comprising:
   correlating the dimensions of a first set of control patterns printed in a lithographic resist layer, measured at two or more locations on or within each pattern that correspond to different optimum focus settings, to the dose and focus settings of the pattern imaging system to produce dependencies;
   measuring the dimensions on subsequent sets of control patterns printed in a lithographic resist layer at two or more locations on or within each pattern, of which a minimum of two locations corresponding to different optimum focus settings match those measured in the first set; and
   determining the effective dose and defocus values associated with forming the subsequent sets of control patterns by comparing the dimensions at the matching locations with the correlated dependencies.

2. The method of claim 1 wherein the locations of the different optimum focus settings on or within a pattern correspond to different heights on a profile of the pattern in the resist layer.

3. The method of claim 2 wherein one of the heights comprises a reference height on the profile of the pattern at or near the bottom of the thickness of the resist layer.

4. The method of claim 2 wherein optimum focus at each height is defined as the focus setting at which the rate of change of critical dimension with focus is zero.

5. The method of claim 1 wherein the set of control patterns is designed so that the correlated dependencies of its measured dimensions to dose and focus are decoupled from one another.

6. The method of claim 1 further including determining the dimensions of the subsequent set of control patterns at all measured and unmeasured locations for which the correlated dependencies have been determined by substitution of the effective dose and defocus values in the correlated dependencies.

7. The method of claim 1 wherein each of the control patterns has an isolated feature with a pitch greater than twice a width of an individual or repeating feature in a measurement direction.

8. The method of claim 7 wherein the widths at different heights of the subsequent sets of control pattern features are measured at different locations along the plane of the resist layer, and at different times.

9. The method of claim 1 wherein the measured dimensions of the first and subsequent sets of control patterns comprise widths of the printed control pattern features as measured at or near the top of the thickness of the resist layer and at or near the bottom of the thickness of the resist layer.

10. The method of claim 1 wherein the dimensions of the first set of control patterns are measured in a calibration process, and the dimensions of the subsequent set of control patterns are measured in a production process.

11. The method of claim 1 wherein the correlated dependencies are created using a pre-determined parametric model, and determine optimum dose and focus settings for the pattern imaging system.

12. The method of claim 1 wherein the dimensions of the subsequent sets of control patterns widths are converted to deviations of effective exposure dose and defocus, which are then used to adjust exposure dose and focus settings in the lithographic pattern imaging and processing system.

13. The method of claim 1 further including correlating the dimensions of a first set of monitor patterns printed in a lithographic resist layer, measured at one or more locations on or within each monitor pattern, to the dose and focus settings of the pattern imaging system to produce dependencies; and
   determining the dimensions of any monitor patterns printed simultaneously with the subsequent sets of control patterns, at all locations for which correlated dependencies of the monitor patterns on dose and defocus have been determined, by substitution of the effective dose and defocus values in the correlated dependencies of the monitor patterns.

14. A method of controlling imaging and process parameters in a lithographic process comprising:
   providing a control pattern having an isolated feature with a pitch greater than twice a width of an individual or repeating feature in a measurement direction;
   exposing a resist layer having a thickness on a calibration substrate with the control pattern design at a plurality of different exposure dose and focus settings;
   developing the exposed resist layer to produce a calibration resist layer having a plurality of printed control patterns representing different exposure dose and focus settings, each control pattern having at least one printed feature;
   for each exposure dose and focus setting, measuring width of the printed calibration control pattern feature at a plurality of different heights along the thickness of the resist layer;
   determining optimum dose and focus settings from the measured widths at different heights of the printed calibration control pattern features and creating control pattern model parameters;
   printing control patterns at fixed exposure dose and focus settings on a production substrate in a production process;
   measuring width of the printed production control pattern features at a plurality of different heights along the thickness of the resist layer;
   comparing the measured widths at different heights of the printed production control pattern features with the control pattern model parameters; and
   adjusting imaging and process parameter settings in the production process based on the comparison of the measured widths at different heights of the printed production control pattern features and control pattern model parameters.

15. The method of claim 14 wherein, on the resist layer calibration substrate, the dose range encompasses a dose sufficient to produce a desired pattern dimension and the focus range encompasses optimum focus settings over a substantial portion of the thickness of the resist layer.

16. The method of claim 14 wherein the widths of the printed calibration and production control pattern features are measured at or near the top of the thickness of the resist layer and at or near the bottom of the thickness of the resist layer.

17. The method of claim 14 wherein the widths at different heights of the printed production control pattern features are measured at different locations along the plane of the resist layer, and at different times during the process.

18. The method of claim 14 wherein the measured widths at different heights of the printed production control pattern features are converted to deviations of effective exposure dose and focus, and wherein the deviations of effective exposure dose and focus are used to adjust the imaging and process parameter settings in the production process.

19. The method of claim 14 further including providing a set of one or more monitor patterns;

exposing and developing the resist layer to print a plurality of calibration monitor patterns and one control pattern representing different exposure dose and focus settings in the resist layer;

for each exposure dose and focus setting, measuring width of the printed calibration monitor pattern features and the printed control pattern feature at a plurality of different heights along the thickness of the resist layer;

determining optimum dose and focus settings from the measured widths at different heights of the printed calibration monitor and control pattern features and creating monitor and control pattern model parameters;

printing control and monitor patterns at fixed exposure dose and focus settings on a production substrate in a production process;

computing the widths of the monitor pattern features at the plurality of heights for which model parameters have been determined; and adjusting imaging and process parameter settings in the production process based on comparison of the measured widths of the control patterns and the computed widths of the monitor patterns and their dependencies on dose and focus.

20. The method of claim 19 wherein the widths of the printed calibration and production control pattern features are measured at or near the top and bottom of the thickness of the resist layer.

21. The method of claim 20 wherein the widths of the printed production control pattern features are measured at different locations along the plane of the resist layer, and at different times during the process.

22. The method of claim 14 wherein optimum focus at each height is defined as the focus setting at which the rate of change of critical dimension with focus is zero.

* * * * *